(12) United States Patent
Kawai

(10) Patent No.: US 7,212,066 B2
(45) Date of Patent: May 1, 2007

(54) CHARGE PUMP CIRCUIT

(75) Inventor: Shuhei Kawai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/212,918

(22) Filed: Aug. 29, 2005

(65) Prior Publication Data

US 2006/0049867 A1    Mar. 9, 2006

(30) Foreign Application Priority Data

Aug. 30, 2004    (JP) .............................. 2004-250574

(51) Int. Cl.
*G05F 1/46* (2006.01)
(52) U.S. Cl. .................... 327/536; 327/537; 363/60
(58) Field of Classification Search ............ None
See application file for complete search history.

(56) References Cited

U.S. PATENT DOCUMENTS 6,448,841 B1 * 9/2002 Milazzo ................. 327/536
6,831,499 B2 * 12/2004 Oddone et al. ............ 327/536
7,084,697 B2 * 8/2006 Kawagoshi ................ 327/536

FOREIGN PATENT DOCUMENTS

JP    2003-033006    1/2003

* cited by examiner

*Primary Examiner*—Timothy P. Callahan
*Assistant Examiner*—Terry L. Englund
(74) *Attorney, Agent, or Firm*—Morrison & Foerster LLP

(57) ABSTRACT

A leakage path through a parasitic diode in a charge transfer MOS transistor is cut off to prevent increase in the power consumption and loss of control of a charge pump circuit. A first charge transfer MOS transistor and a second charge transfer MOS transistor are N-channel type and are connected in series with each other. A ground electric potential VSS is supplied to a source of the first charge transfer MOS transistor as an input electric potential, and an output electric potential is obtained from an output terminal connected with a drain of the second charge transfer MOS transistor. A back gate of the first charge transfer MOS transistor is set by a first switching circuit to either an electric potential at a connecting node between the first and the second charge transfer MOS transistors or the ground electric potential VSS.

11 Claims, 4 Drawing Sheets

Charge Pump Circuit in Operation ( Vout > VDD )

Charge Pump Circuit not in Operation ( Vout = Vss < VDD )

CHARGE PUMP CIRCUIT

CROSS-REFERENCE OF THE INVENTION

This invention is based on Japanese Patent Application No. 2004-250574, the content of which is incorporated herein by reference in its entirety.

BACKGROUND OF THE INVENTION

1. Field of the Invention

This invention relates to a charge pump circuit used in a power supply circuit for an integrated circuit and the like.

2. Description of the Related Art

The charge pump circuit is a circuit composed of charge transfer MOS transistors, a capacitor, a clock driver and other components. It converts an input electric potential into a positive high electric potential or a negative electric potential and outputs the converted electric potential. The charge pump circuit is widely used as a power supply circuit for an integrated circuit and the like.

Further information on the charge pump circuit is disclosed in Japanese Patent Application Publication No. 2003-33006, for example.

However, in some application in which the output of the charge pump circuit varies, ranging from a positive electric potential to a negative electric potential, there has been a problem that an unwanted forward current flows through a parasitic diode accompanying the charge transfer MOS transistor to increase a power consumption or to get a circuit using the charge pump circuit out of control.

SUMMARY OF THE INVENTION

The invention offers a charge pump circuit that includes a first charge transfer MOS transistor connected with an input terminal, a second charge transfer MOS transistor connected in series with the first charge transfer MOS transistor, and a capacitor having a first terminal and a second terminal. The first terminal is connected with the first charge transfer MOS transistor and the second charge transfer MOS transistor. The charge pump circuit also includes a clock driver supplying a clock to the second terminal of the capacitor, a control circuit switching on and off the first charge transfer MOS transistor and the second charge transfer MOS transistor, a first switching circuit that connects a back gate of the first charge transfer MOS transistor with the input terminal or the first terminal of the capacitor, and an output terminal connected with the second charge transfer MOS transistor.

DETAILED DESCRIPTION OF THE INVENTION

Figure 1:
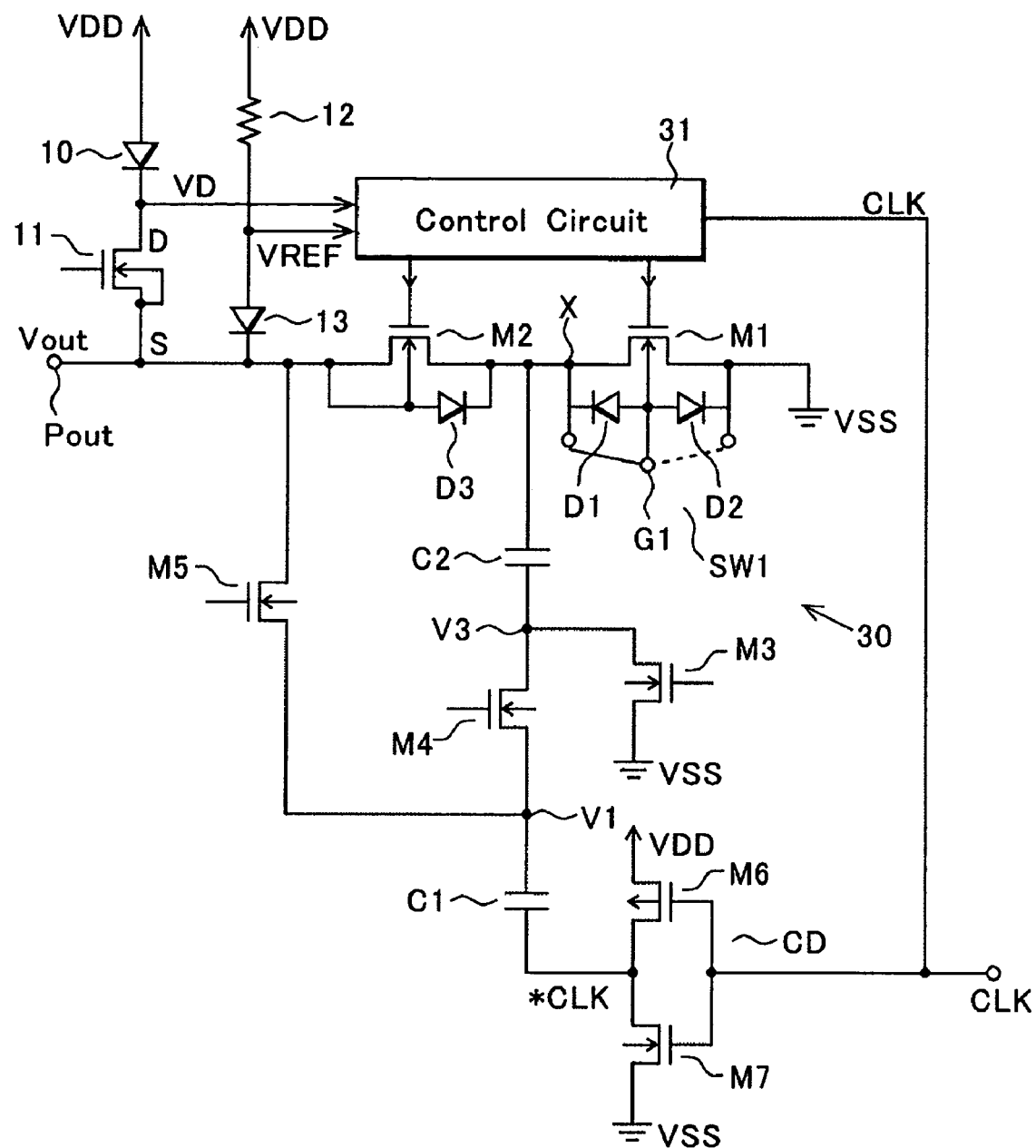
FIG. 1 is a circuit diagram of a charge pump circuit according to a first embodiment of this invention.

Next, a charge pump circuit according to a first embodiment of this invention will be explained hereinafter referring to the drawings. FIG. 1 is a circuit diagram showing a driver circuit of a white light emitting diode (hereafter referred to as a white LED) in which the charge pump circuit is used as a power supply circuit. A power supply electric potential VDD is supplied to an anode of the white LED 10 that is used as a back light of a liquid crystal display panel, as shown in FIG. 1. A cathode of the white LED 10 is connected to a drain of a driver MOS transistor 11 that provides the white LED 10 with a drive current. The white LED 10 has a forward threshold voltage of 3.2 V–3.8 V that is required to be applied between the anode and the cathode of the white LED 10 to drive it.

On the other hand, the power supply electric potential VDD for the white LED 10 is required to have a wide range of operating voltage such as 2.7 V–5.5 V. In the driver circuit in this embodiment, therefore, a charge pump circuit 30 is put into operation to generate a negative electric potential when the power supply electric potential VDD is low, so that the voltage required to be applied between the anode and the cathode is secured by lowering an electric potential at a source of the driver MOS transistor 11. When the power supply electric potential VDD is high, the operation of the charge pump circuit 30 is brought to a halt and the electric potential at the source of the driver MOS transistor 11 is raised to apply a constant voltage across the source and the drain of the driver MOS transistor 11 so that a constant current is supplied to the white LED 10. A concrete circuit structure will be described below.

The charge pump circuit 30 includes a first charge transfer MOS transistor M1, a second charge transfer MOS transistor M2, a first capacitor C1, a second capacitor C2, switching MOS transistors M3, M4 and M5, a clock driver CD (including a P-channel type MOS transistor M6 and an N-channel type MOS transistor M7) to drive clocks CLK and a control circuit 31 that controls turning on/off of the first charge transfer MOS transistor M1 and the second charge transfer MOS transistor M2.

The first charge transfer MOS transistor M1 and the second charge transfer MOS transistor M2 are N-channel type and are connected in series with each other. A ground electric potential VSS is supplied to a source of the first charge transfer MOS transistor M1, and an output electric potential Vout is obtained from an output terminal Pout connected to a drain of the second charge transfer MOS transistor M2. A back gate G1 of the first charge transfer MOS transistor M1 is structured to be set by a first switching circuit SW1 to either an electric potential X at a connecting node between the first and the second charge transfer MOS transistors M1 and M2 or the ground electric potential VSS that is an input electric potential.

Figure 2:
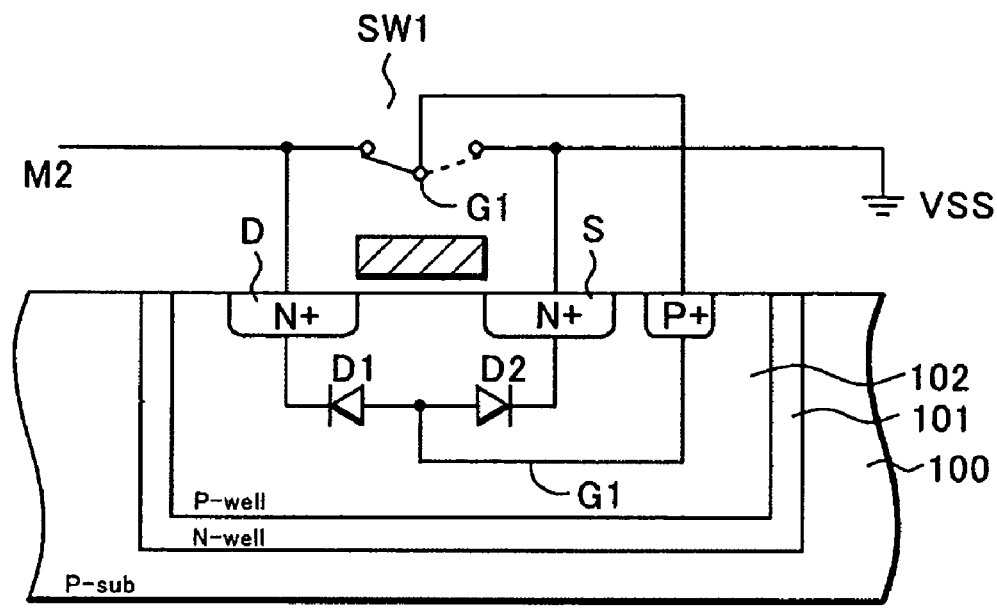
FIG. 2 is a cross-sectional view showing a first charge transfer MOS transistor in the charge pump circuit according to the first embodiment of this invention.

FIG. 2 shows a cross-sectional structure of the first charge transfer MOS transistor M1. An N-type well region 101 is formed in a surface of a P-type semiconductor substrate 100, a P-type well region 102 is formed in the N-type well region 101 and the first charge transfer MOS transistor M1 is formed in the P-type well region 102. The P-type well region 102 makes the back gate of the first charge transfer MOS transistor M1. A parasitic diode D1 is formed of a drain region D and the P-type well region 102, while another parasitic diode D2 is formed of the source S and the P-type well region 102.

The control circuit 31 is provided with the clocks CLK, an electric potential VD at a connecting node (the drain D of the driver MOS transistor 11) between the white LED 10 and the driver MOS transistor 11 and a reference electric potential VREF that is an electric potential at a connecting node between a high resistance device 12 and a diode 13. The control circuit 31 controls electric potential at gates of the first and second charge transfer MOS transistors M1 and M2 based on the clocks CLK so that the first and second charge transfer MOS transistors M1 and M2 turn on and off alternatively when the charge pump circuit 30 is in operation.

The control circuit 31 turns on both the first and second charge transfer MOS transistors M1 and M2 and controls an ON resistance of the first charge transfer MOS transistor M1 so that the electric potential VD becomes equal to the reference electric potential VREF when the charge pump circuit 30 halts the operation. The control is performed by an operational amplifier (not shown) in the control circuit 31. That is, assuming that a forward threshold voltage of the diode 13 is VF, a voltage across the source and the drain of the driver MOS transistor 11 is controlled to become equal to VF. It is made possible as a result that a constant current flows through the driver MOS transistor 11.

Next, a detailed operation of the driver circuit of the white LED described above will be explained. First, when the power supply electric potential VDD is lower than a predetermined value, the charge pump circuit 30 is put into operation so that a negative electric potential −0.5VDD is outputted as the output electric potential Vout from the output terminal Pout. This makes it possible for the driver circuit to drive the white LED, because a voltage of 1.5VDD is applied across the white LED 10 and the driver MOS transistor 11.

At that time, the back gate G1 of the first charge transfer MOS transistor M1 is set to the electric potential X at the connecting node between the first and the second charge transfer MOS transistors M1 and M2 by the first switching circuit SW1, as shown with a solid line in FIG. 1. As a result, a back gate bias effect on the first charge transfer MOS transistor M1 is suppressed, while a reverse current is prevented with an effect of the parasitic diode D2.

The operation of the charge pump circuit 30 in this case is hereafter described in detail. The operation when the clock CLK is at a low level is explained first. At that time, a reverse clock *CLK becomes a high level (VDD level), since M6 in the clock driver CD is turned on while M7 in the clock driver CD is turned off. At the same time, M1 and M4 are turned on while M2, M3 and M5 are turned off.

As a result, M6 in the clock driver CD, the first capacitor C1, M4, the second capacitor C2 and M1 are connected in series between the power supply VDD and the ground VSS to charge the first capacitors C1 and the second capacitor C2. A first terminal of the first capacitor C1 is charged to VDD, an electric potential V1 at a second terminal of the first capacitor C1 is charged to +0.5 VDD and an electric potential V3 at a first terminal of the second capacitor C2 is also charged to +0.5 VDD.

Next, the operation when the clock CLK is at the high level is explained. At that time, a reverse clock *CLK becomes the low level (VSS level), since M7 in the clock driver CD is turned on while M6 in the clock driver CD is turned off. At the same time, M1 and M4 are turned off while M2, M3 and M5 are turned on. Then the output terminal Pout is provided with −0.5VDD through two paths. Electric charges in the second capacitor C2 are discharged to provide the output terminal Pout with −0.5VDD through one of the paths that runs from the ground electric potential VSS to the output terminal Pout through M3, the second capacitor C2 and M2.

This is because the electric potential V3 at the first terminal of the second capacitor C2 is charged to +0.5VDD when the clock CLK is at the low level and the electric potential X at the second terminal of the second capacitor C2 is lowered from the ground electric potential VSS (0V) to −0.5 VDD by a capacitive coupling through the second capacitor C2 when M3 is turned on to change the electric potential V3 from +0.5VDD to the ground electric potential VSS.

Electric charges in the first capacitor C1 is discharged to provide the output terminal Pout with −0.5VDD through another path that runs from the ground VSS to the output terminal Pout through the N-channel type MOS transistor M7 in the clock driver CD, the first capacitor C1 and M5. This is because the electric potential V1 at the second terminal of the first capacitor C1 is charged to +0.5VDD when the clock CLK is at the low level and the electric potential V1 at the second terminal of the first capacitor C1 is lowered from +0.5VDD to −0.5VDD by a capacitive coupling through the first capacitor C1 when the clock CLK turns to the high level and M7 is turned on to change the electric potential at the first terminal of the first capacitor C1 from the power supply electric potential VDD to the ground electric potential VSS. The output voltage Vout of −0.5Vdd that is the power supply voltage VDD multiplied by −0.5 is obtained by alternately repeating the operation when the clock CLK is at the low level and the operation when the clock CLK is at the high level.

When the power supply electric potential VDD is higher than the predetermined value, the charge pump circuit 30 halts the operation. That is, the clock CLK is stopped or kept from entering into the circuit. As described above, both the first and second charge transfer MOS transistors M1 and M2 are turned on and the ON resistance of the first charge transfer MOS transistor M1 is controlled so that the electric potential VD becomes equal to the reference electric potential VREF. As a result, the constant current flows through the driver MOS transistor 11. The output electric potential Vout at the output terminal Pout is made higher than the ground electric potential VSS because of the ON resistance of M1 and M2. That is, the output electric potential Vout at the output terminal Pout becomes positive. Thus unwanted forward current flows through the parasitic diodes D2 and D3 in the first and second charge transfer MOS transistors M1 and M2, making the output electric potential Vout at the output terminal Pout uncontrollable if no countermeasure is taken.

To solve the problem, the back gate G1 of the first charge transfer MOS transistor M1 is switched to be connected to the ground electric potential VSS by the first switching circuit SW1, as shown with a dashed line in FIG. 1. By doing so, the parasitic diode D1 is reverse biased to cutoff the current from the output terminal Pout to the ground electric potential VSS through the diodes.

According to the charge pump circuit 30 of this embodiment, as described above, a leakage current path through the diodes can be eliminated and the driver circuit of the white LED 10 can be properly controlled by switching the connection of the back gate G1 under conditions that the output electric potential Vout at the output terminal Pout becomes both the positive electric potential and the negative electric potential. As an alternative method to eliminate the leakage path through the diodes, another MOS transistor may be connected serially to the first and second charge transfer MOS transistors M1 and M2.

However, this method increases the ON resistance of the MOS transistors in the charge transfer path, making the large output current not available. To suppress the increase in the ON resistance, sizes of the transistors that are designed large for the charge transfer have to be made even larger, resulting in an increase in a layout area. According to the charge pump circuit 30 of this embodiment, the problem is solved only by switching the connection of the back gate G1 of one of the charge transfer MOS transistors. Since transistors of small size are enough to form the first switching circuit SW1, the increase in the layout area can be suppressed.

Figure 3:
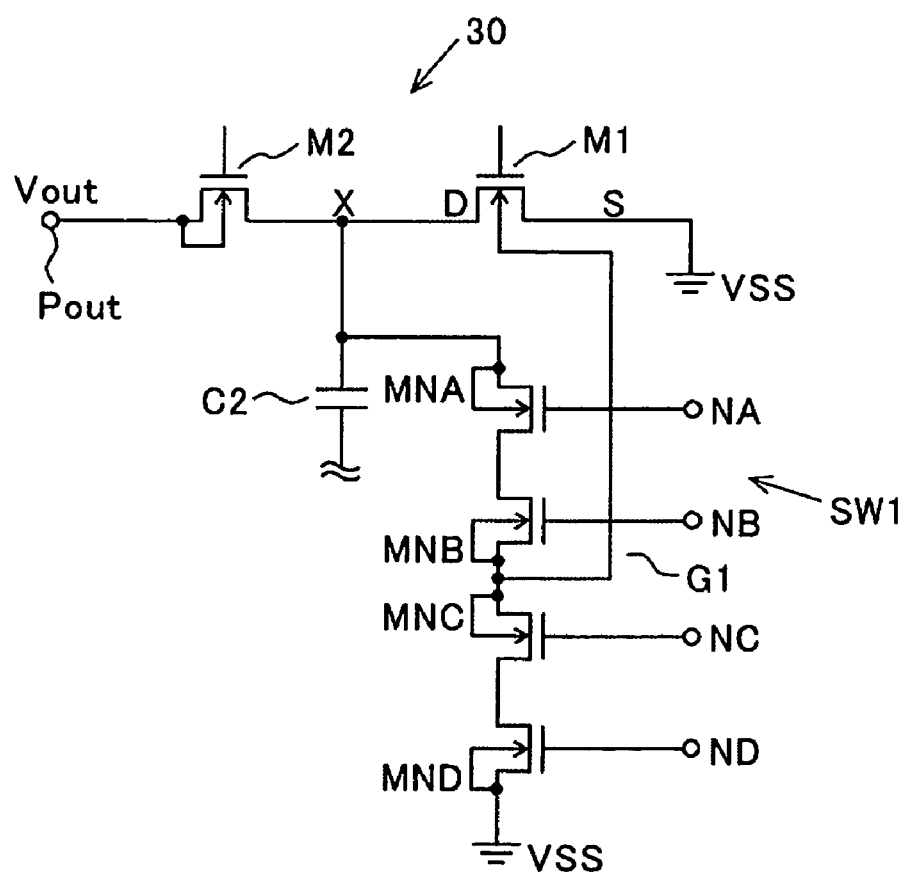
FIG. 3 is a concrete circuit diagram of a switching circuit in the charge pump circuit according to the first embodiment of this invention.

Next, a concrete circuit structure of the first switching circuit SW1 will be described hereinafter, referring to FIG. 3. FIG. 3 is a circuit diagram showing a related portion extracted from FIG. 1. The parasitic diodes D1, D2 and D3 are not shown in FIG. 3. Two N-channel type switching MOS transistors MNA and MNB are connected in series between the back gate G1 of the first charge transfer MOS transistor M1 and the connecting node (electric potential X) between the first and the second charge transfer MOS transistors M1 and M2. Another two N-channel type switching MOS transistors MNC and MND are connected in series between the back gate G1 of the first charge transfer MOS transistor M1 and the ground electric potential VSS. Each gate of the switching MOS transistors MNA, MNB, MNC and MND is denoted as each of NA, NB, NC and ND, respectively.

When the charge pump circuit 30 operates to output the negative electric potential −0.5 VDD as the output electric potential Vout from the output terminal Pout, the power supply electric potential VDD is applied to NA and NB to turn on MNA and MNB. Also the electric potential X is applied to NC and the ground electric potential VSS is applied to ND to turn off MNC and MND. With this, the back gate G1 of the first charge transfer MOS transistor M1 is set at the electric potential X.

On the other hand, when the charge pump circuit 30 halts the operation and outputs the positive electric potential as the output electric potential Vout from the output terminal Pout, the power supply electric potential VDD is applied to NC and ND to turn on MNC and MND. Also the electric potential X is applied to NA and the ground electric potential VSS is applied to NB to turn off MNA and MNB. With this, the back gate G1 of the first charge transfer MOS transistor M1 is set at the ground electric potential VSS. As a result, the current from the output terminal Pout to the ground electric potential VSS through the diodes can be prevented both when the charge pump circuit 30 is in operation and when it halts the operation.

Figure 4:
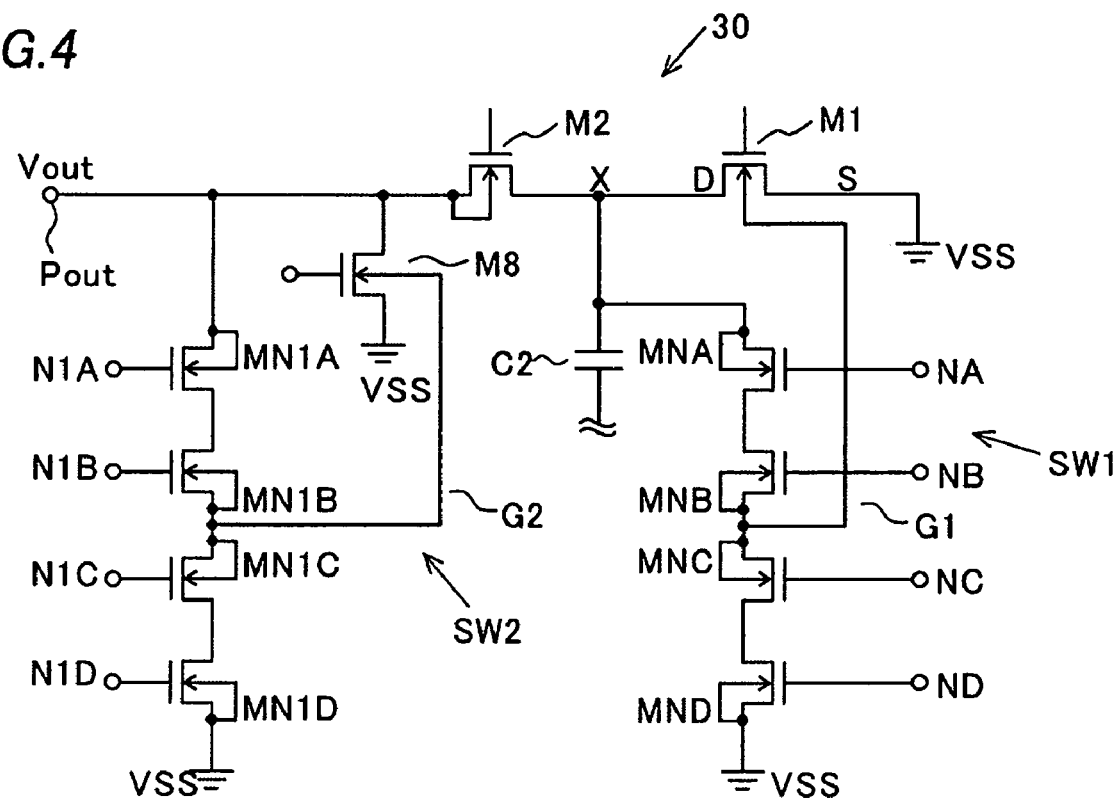
FIG. 4 is a circuit diagram of a charge pump circuit according to a second embodiment of this invention.

Next, a charge pump circuit according to a second embodiment of this invention will be explained hereinafter referring to FIG. 4. The charge pump circuit 30 in the second embodiment includes an N-channel type pull-down MOS transistor M8 connected between the output terminal Pout and the ground electric potential VSS, in addition to the charge pump circuit in the first embodiment. When the operation of the charge pump circuit 30 is brought to a halt, both the first and second charge transfer MOS transistors M1 and M2 are turned on, as described above. In some cases, however, the impedance between the output electric potential Vout and the ground electric potential VSS can not be reduced enough to provide the white LED 10 with the predetermined constant current.

Thus the pull-down MOS transistor M8 is turned on to reduce the impedance between the output electric potential Vout and the ground electric potential VSS, when the operation of the charge pump circuit 30 is brought to a halt. The pull-down MOS transistor M8 is turned off when the charge pump circuit 30 is in operation. Turning on/off of the pull-down MOS transistor M8 is controlled by the control circuit 31.

Similar to the first charge transfer MOS transistor M1, the pull-down MOS transistor M8 is provided with a second switching circuit SW2 that switches a connection of the back gate G2 of the pull-down MOS transistor M8 so that the back gate G2 is connected to the ground electric potential VSS when the charge pump circuit 30 halts the operation and that the back gate G2 is connected to the output electric potential Vout when the charge pump 30 is in operation, in order to prevent an unwanted forward current from flowing through a parasitic diode attached to the pull-down MOS transistor M8.

Next, a concrete circuit structure of the second switching circuit SW2 will be described hereinafter, referring to FIG. 4. Two N-channel type switching MOS transistors MN1A and MN1B are connected in series between the back gate G2 of the pull-down MOS transistor M8 and the output terminal Pout. Another two N-channel type switching MOS transistors MN1C and MN1D are connected in series between the back gate G2 of the pull-down MOS transistor M8 and the ground electric potential VSS. Each gate of the switching MOS transistors MN1A, MN1B, MN1C and MN1D is denoted as each of N1A, N1B, N1C and N1D, respectively.

When the charge pump circuit 30 operates to output the negative electric potential −0.5 VDD as the output electric potential Vout from the output terminal Pout, the power supply electric potential VDD is applied to N1A and N1B to turn on MN1A and MN1B. Also the output electric potential Vout is applied to N1C and the ground electric potential VSS is applied to N1D to turn off MN1C and MN1D. With this, the back gate G2 of the pull-down MOS transistor M8 is set at the output electric potential Vout.

On the other hand, when the charge pump circuit 30 halts the operation and outputs the positive electric potential as the output electric potential Vout from the output terminal Pout, the power supply electric potential VDD is applied to N1C and N1D to turn on MN C and MN1D.

Also the output electric potential Vout is applied to N1A and the ground electric potential VSS is applied to N1B to turn off MN1A and MN1B. With this, the back gate G2 of the pull-down MOS transistor M8 is set at the ground electric potential VSS. As a result, the current from the output terminal Pout to the ground electric potential VSS through the parasitic diode can be prevented both when the charge pump circuit 30 is in operation and when it halts the operation. Note that the second switching circuit SW2 may be composed of the two N-channel type switching MOS transistors MN1B and MN1C.

Figure 5:
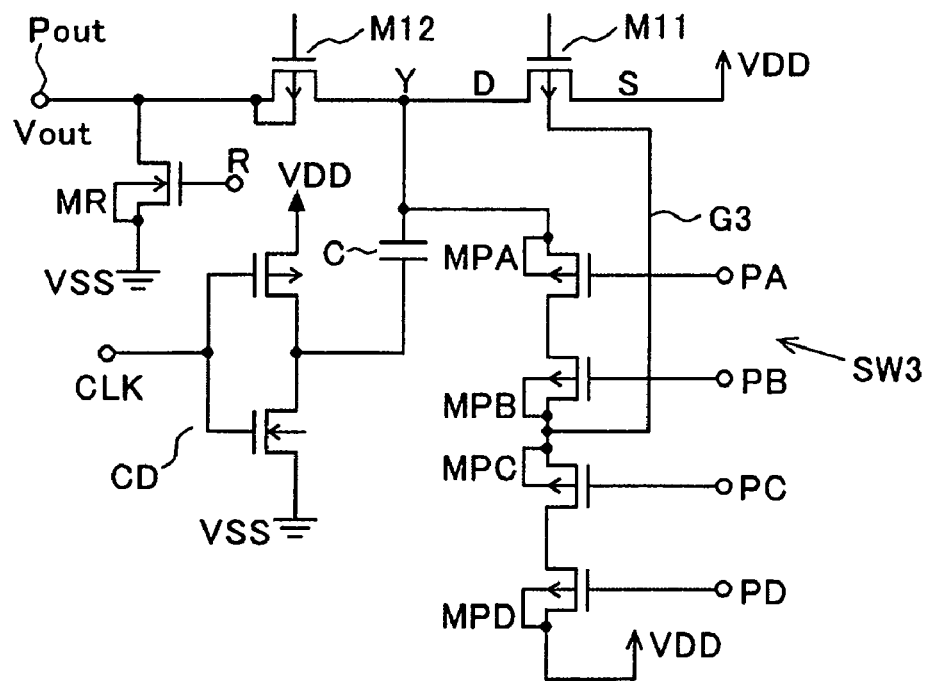
FIG. 5 is a circuit diagram of a charge pump circuit according to a third embodiment of this invention.

Next, a charge pump circuit according to a third embodiment of this invention will be explained hereinafter referring to FIG. 5. The charge pump circuit in the third embodiment outputs a positive boosted electric potential from the output terminal Pout. A first and a second P-channel type charge transfer MOS transistors M11 and M12 are connected in series. A source of the first charge transfer MOS transistor M11 is provided with the power supply electric potential VDD. A first terminal of a capacitor C is connected to a connecting node between the first and second charge transfer MOS transistors M11 and M12. An output of a clock driver CD made of a CMOS inverter is applied to a second terminal of the capacitor C. An N-channel type reset MOS transistor MR is connected between the output terminal Pout and the ground electric potential VSS.

Clocks CLK are applied to an input of the clock driver CD. A back gate G3 of the first charge transfer MOS transistor M11 is switched by a switching circuit SW3 so that the back gate G3 is set to an electric potential Y at a connecting node between the first and the second charge transfer MOS transistors M11 and M12 when the charge pump circuit is in operation and that the back gate G3 is set to the power supply electric potential VDD when the charge pump circuit halts the operation.

A concrete circuit structure of the switching circuit SW3 is described below. Two P-channel type switching MOS transistors MPA and MPB are connected in series between the back gate G3 of the first charge transfer MOS transistor M11 and the connecting node (electric potential Y) between the first and the second charge transfer MOS transistors M11 and M12. Another two P-channel type switching MOS transistors MPC and MPD are connected in series between the back gate G3 of the first charge transfer MOS transistor M11 and the power supply electric potential VDD. Each gate of the switching MOS transistors MPA, MPB, MPC and MPD is denoted as each of PA, PB, PC and PD, respectively.

When the charge pump circuit operates to output the positive electric potential (2VDD, for example) as an output electric potential Vout from an output terminal Pout, the ground electric potential VSS is applied to PA and PB to turn on MPA and MPB. Also the electric potential Y is applied to PC and the power supply electric potential VDD is applied to PD to turn off MPC and MPD. With this, the back gate G3 of the first charge transfer MOS transistor M11 is set at the electric potential Y. A gate R of the reset MOS transistor MR is set to a low level to turn off the reset MOS transistor MR.

On the other hand, the reset MOS transistor MR is turned on when the charge pump circuit halts the operation. The ground electric potential VSS is applied to PC and PD to turn on MPC and MPD. Also the electric potential Y is applied to PA and the power supply electric potential VDD is applied to PB to turn off MPA and MPB. With this, the back gate G3 of the first charge transfer MOS transistor M11 is set at the power supply electric potential VDD.

Figure 6A:
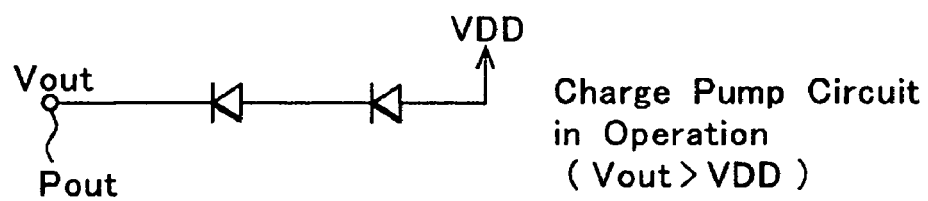
FIGS. 6A and 6B show parasitic diodes in the charge pump circuit according to the third embodiment of this invention.
Figure 6B:
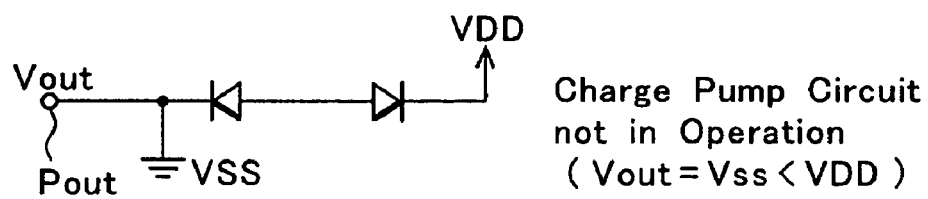

Because parasitic diodes shown in FIG. 6A are formed as a result when the charge pump circuit is in operation, a current through the diodes can be prevented from flowing from the output terminal Pout to the power supply electric potential VDD. Also because parasitic diodes shown in FIG. 6B are formed when the charge pump circuit halts the operation, while the output terminal Pout is reset to the ground electric potential VSS, a current through the diodes can be prevented from flowing from the power supply electric potential VDD to the output terminal Pout (at the ground electric potential VSS). Thus the power consumption during the halt of the operation of the charge pump circuit can be reduced.

Figure 7:
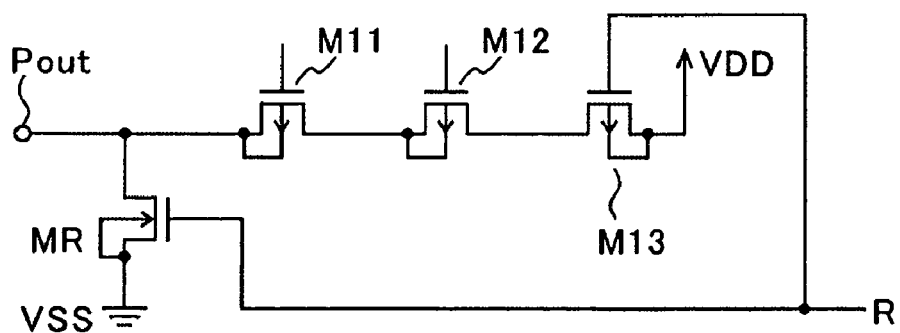
FIG. 7 is a circuit diagram of a charge pump circuit according to a reference example.

As an alternative method to eliminate the leakage path through the diodes in the charge pump circuit, another MOS transistor M13 may be connected serially to the first and second charge transfer MOS transistors M11 and M12, as shown in FIG. 7. However, this method increases the ON resistance of the MOS transistors in the charge transfer path, making the large output current not available.

To suppress the increase in the ON resistance, sizes of the transistors that are designed large for the charge transfer have to be made even larger, resulting in an increase in a layout area. According to the charge pump circuit of the third embodiment, the problem is solved only by switching the connection of the back gate G3 of one of the charge transfer MOS transistors. Since transistors of small size are enough to form the switching circuit SW3, the increase in the layout area can be suppressed.

According to the embodiments of this invention, the leakage path through the parasitic diode can be cut off by switching the connection of the back gate to prevent the increase in the power consumption and loss of control of the circuit, even when the output of the charge pump circuit varies, ranging from the positive electric potential to the negative electric potential as some of the applications would require.

What is claimed is:

1. A charge pump circuit comprising:
   a first charge transfer MOS transistor connected with an input terminal;
   a second charge transfer MOS transistor connected in series with the first charge transfer MOS transistor;
   a capacitor comprising a first terminal and a second terminal, the first terminal being connected with the first charge transfer MOS transistor and the second charge transfer MOS transistor;
   a clock driver supplying a clock to the second terminal of the capacitor;
   a control circuit switching on and off the first charge transfer MOS transistor and the second charge transfer MOS transistor;
   a first switching circuit that connects a back gate of the first charge transfer MOS transistor with the input terminal or the first terminal of the capacitor; and
   an output terminal connected with the second charge transfer MOS transistor,
   wherein the first switching circuit connects the back gate of the first charge transfer MOS transistor with the first terminal of the capacitor when the clock driver supplies the clock and connects the back gate of the first charge transfer MOS transistor with the input terminal when the clock driver supplies no clock.

2. The charge pump circuit of claim 1, further comprising a pull-down MOS transistor that is connected between the output terminal and a ground and a second switching circuit that connects a back gate of the pull-down MOS transistor with the output terminal when the clock driver supplies the clock and connects the back gate of the pull-down MOS transistor with the ground when the clock driver supplies no clock.

3. The charge pump circuit of claim 1, wherein the first switching circuit comprises a first switch connected between the back gate of the first charge transfer MOS transistor and the first terminal of the capacitor and a second switch connected between the back gate of the first charge transfer MOS transistor and the input terminal.

4. The charge pump circuit of claim 3, wherein the first switch comprises a first control MOS transistor and a second control MOS transistor that are connected in series.

5. The charge pump circuit of claim 4, wherein a first electric potential is applied to a gate of the first control MOS transistor and a gate of the second control MOS transistor to turn the first switch on, and an electric potential at the first terminal of the capacitor is applied to the gate of the first control MOS transistor and an electric potential at the input terminal is applied to the gate of the second control MOS transistor to turn the first switch off.

6. The charge pump circuit of claim 3, wherein the second switch comprises a first control MOS transistor and a second control MOS transistor that are connected in series.

7. The charge pump circuit of claim 6, wherein a first electric potential is applied to a gate of the first control MOS transistor and a gate of the second control MOS transistor to turn the second switch on, and an electric potential at the first terminal of the capacitor is applied to the gate of the first control MOS transistor and an electric potential at the input terminal is applied to the gate of the second control MOS transistor to turn the second switch off.

8. A charge pump circuit comprising:
a first charge transfer MOS transistor connected with an input terminal;
a second charge transfer MOS transistor connected in series with the first charge transfer MOS transistor;
a capacitor comprising a first terminal and a second terminal, the first terminal being connected with the first charge transfer MOS transistor and the second charge transfer MOS transistor;
a clock driver supplying a clock to the second terminal of the capacitor;
a control circuit switching on and off the first charge transfer MOS transistor and the second charge transfer MOS transistor;
a first switching circuit that connects a back gate of the first charge transfer MOS transistor with the input terminal or the first terminal of the capacitor;
an output terminal connected with the second charge transfer MOS transistor;
a pull-down MOS transistor that is connected between the output terminal and a ground and;
a second switching circuit that connects a back gate of the pull-down MOS transistor with the output terminal when the clock driver supplies the clock and connects the back gate of the pull-down MOS transistor with the ground when the clock driver supplies no clock.

9. A charge pump circuit comprising:
a first charge transfer MOS transistor connected with an input terminal;
a second charge transfer MOS transistor connected in series with the first charge transfer MOS transistor;
a capacitor comprising a first terminal and a second terminal, the first terminal being connected with the first charge transfer MOS transistor and the second charge transfer MOS transistor;
a clock driver supplying a clock to the second terminal of the capacitor;
a control circuit switching on and off the first charge transfer MOS transistor and the second charge transfer MOS transistor;
a first switching circuit that connects a back gate of the first charge transfer MOS transistor with the input terminal or the first terminal of the capacitor; and
an output terminal connected with the second charge transfer MOS transistor,
wherein the first switching circuit comprises a first switch connected between the back gate of the first charge transfer MOS transistor and the first terminal of the capacitor and a second switch connected between the back gate of the first charge transfer MOS transistor and the input terminal,
the first switch comprises a first control MOS transistor and a second control MOS transistor that are connected in series, and
a first electric potential is applied to a gate of the first control MOS transistor and a gate of the second control MOS transistor to turn the first switch on, and an electric potential at the first terminal of the capacitor is applied to the gate of the first control MOS transistor and an electric potential at the input terminal is applied to the gate of the second control MOS transistor to turn the first switch off.

10. A charge pump circuit comprising:
a first charge transfer MOS transistor connected with an input terminal;
a second charge transfer MOS transistor connected in series with the first charge transfer MOS transistor;
a capacitor comprising a first terminal and a second terminal, the first terminal being connected with the first charge transfer MOS transistor and the second charge transfer MOS transistor;
a clock driver supplying a clock to the second terminal of the capacitor;
a control circuit switching on and off the first charge transfer MOS transistor and the second charge transfer MOS transistor;
a first switching circuit that connects a back gate of the first charge transfer MOS transistor with the input terminal or the first terminal of the capacitor; and
an output terminal connected with the second charge transfer MOS transistor,
wherein the first switching circuit comprises a first switch connected between the back gate of the first charge transfer MOS transistor and the first terminal of the capacitor and a second switch connected between the back gate of the first charge transfer MOS transistor and the input terminal, and
the second switch comprises a first control MOS transistor and a second control MOS transistor that are connected in series.

11. The charge pump circuit of claim 10, wherein a first electric potential is applied to a gate of the first control MOS transistor and a gate of the second control MOS transistor to turn the second switch on, and an electric potential at the first terminal of the capacitor is applied to the gate of the first control MOS transistor and an electric potential at the input terminal is applied to the gate of the second control MOS transistor to turn the second switch off.

* * * * *